(12) United States Patent
Choe et al.

(10) Patent No.: US 7,566,482 B2
(45) Date of Patent: *Jul. 28, 2009

(54) SOI BY OXIDATION OF POROUS SILICON

(75) Inventors: Kwang Su Choe, Sungnam (KR); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 845 days.

This patent is subject to a terminal disclaimer.

(21) Appl. No.: 10/674,648

(22) Filed: Sep. 30, 2003

(65) Prior Publication Data

US 2005/0067294 A1    Mar. 31, 2005

(51) Int. Cl.
*C23C 14/48* (2006.01)
*C23C 14/08* (2006.01)
*C23C 14/58* (2006.01)
*H01L 21/265* (2006.01)
*H01L 21/316* (2006.01)

(52) U.S. Cl. .............. 427/526; 427/527; 438/798; 438/766; 438/771; 438/787; 438/788; 438/297; 438/440; 438/441; 438/449; 205/123; 205/157

(58) Field of Classification Search .................. None
See application file for complete search history.

(56) References Cited

U.S. PATENT DOCUMENTS

| 4,628,591 | A | * | 12/1986 | Zorinsky et al. | ............ 438/409 |
| 5,023,200 | A | * | 6/1991 | Blewer et al. | .............. 438/597 |
| 5,188,978 | A | * | 2/1993 | deSouza et al. | ............. 438/181 |
| 5,387,541 | A | * | 2/1995 | Hodge et al. | ................ 438/409 |
| 5,854,123 | A | * | 12/1998 | Sato et al. | .................... 438/507 |
| 5,930,643 | A | * | 7/1999 | Sadana et al. | ............... 438/407 |
| 5,950,094 | A | | 9/1999 | Lin et al. | |
| 6,204,546 | B1 | * | 3/2001 | Roitman et al. | ............. 257/506 |

(Continued)

FOREIGN PATENT DOCUMENTS

JP        56-056648        5/1981

(Continued)

OTHER PUBLICATIONS 2 machine translation of JP 9-64 323, cited above.*

(Continued)

*Primary Examiner*—Marianne L Padgett
(74) *Attorney, Agent, or Firm*—Scully, Scott, Murphy & Presser, P.C.; Louis Percello, Esq.

(57) ABSTRACT

A method in which a SOI substrate structure is fabricated by oxidation of graded porous Si is provided. The graded porous Si is formed by first implanting a dopant (p- or n-type) into a Si-containing substrate, activating the dopant using an activation anneal step and then anodizing the implanted and activated dopant region in a HF-containing solution. The graded porous Si has a relatively coarse top layer and a fine porous layer that is buried beneath the top layer. Upon a subsequent oxidation step, the fine buried porous layer is converted into a buried oxide, while the coarse top layer coalesces into a solid Si-containing over-layer by surface migration of Si atoms.

23 Claims, 10 Drawing Sheets

U.S. PATENT DOCUMENTS

| | | | |
|---|---|---|---|
| 6,222,253 B1* | 4/2001 | Sadana et al. | 257/617 |
| 6,486,037 B2* | 11/2002 | Norcott et al. | 438/406 |
| 6,506,658 B2* | 1/2003 | D'Arrigo et al. | 438/359 |
| 6,800,518 B2* | 10/2004 | Bendernagel et al. | 438/207 |
| 6,808,967 B1* | 10/2004 | Aspar et al. | 438/162 |
| 7,067,387 B2* | 6/2006 | Lin | 438/409 |
| 7,084,050 B2* | 8/2006 | Bedell et al. | 438/480 |
| 7,125,458 B2* | 10/2006 | Bedell et al. | 148/239 |
| 7,479,437 B2* | 1/2009 | Greene et al. | 438/303 |
| 2002/0086463 A1* | 7/2002 | Houston et al. | 438/148 |
| 2007/0122956 A1* | 5/2007 | Chidambarrao et al. | 438/197 |
| 2008/0179712 A1* | 7/2008 | de Souza et al. | 257/629 |

FOREIGN PATENT DOCUMENTS

| | | | | |
|---|---|---|---|---|
| JP | 56-110247 | | 9/1981 | |
| JP | 61-180446 | | 8/1986 | |
| JP | 62-108539 | | 5/1987 | |
| JP | 62-245620 | * | 10/1987 | 438/509 |
| JP | 2-164023 | * | 6/1990 | |
| JP | 9-64323 | * | 3/1997 | |
| JP | 2000-012481 | | 1/2000 | |
| JP | 2000-082679 | | 3/2000 | |
| JP | 2000-156484 | | 6/2000 | |

OTHER PUBLICATIONS

Translation of previously cited JP 62-245620 (Hiromitsu).*
Translation of previously cited JP 2-164023 (Ogata).*
Translation of JP 62-108539 A by Shinichiro Kaneko et al., published May 1987.*
Translation of JP 56-110247 A by Yoshihiko Mizushima et al., published Sep. 1981.*

* cited by examiner

SOI BY OXIDATION OF POROUS SILICON

FIELD OF THE INVENTION

The present invention relates to a method of fabricating a semiconductor substrate structure, and more particularly to a method of fabricating a silicon-on-insulator (SOI) substrate structure. The inventive method provides an extremely low cost SOI material that would be attractive for silicon integrated circuit (IC) industries. The SOI material provided by the method of the present invention is scalable to 300 mm.

BACKGROUND OF THE INVENTION

In today's microelectronic IC industry, semiconductor devices are miniaturized to micron ($10^{-6}$) or even nanometer ($10^{-9}$) scale and, as such, are built on the very top surface layer of a semiconductor substrate or wafer. The bulk of the substrate below the top device layer serves little purpose other than being a physical support structure or a heat sink. In fact, electrical and electronic coupling between the top device layer and the bulk can be, in some instances, quite deleterious.

In SOI technology, the SOI layer and bulk substrate layer are separated by a continuous insulating layer referred to as a buried oxide (BOX). This separation or isolation of the device layer (i.e., the SOI layer) can result in significant benefits and performance improvements including, for example, less junction capacitance and leakage; greater resistance to ionizing radiation, electrical noise and heat; immunity to CMOS latch-up; and etc. However, forming SOI structures is no simple matter.

After decades of research and development only a few methods are proven to be commercially viable. In one, called BESOI (bond-and-etch-back SOI), two Si wafers are oxidized at the surface and the oxidized surfaces are bonded together and then one of the two bonded wafers is etched to provide a thin SOI device layer. In this prior art method and its variations, as the wafer surfaces are oxidized before bonding, the buried oxide can be made to have any desired thickness. However, impurities at the bonded interface and the difficulty in achieving a thin, uniform Si over-layer through the etch-back process are major drawbacks. The terms "Si over-layer" and "SOI layer" may be interchangeably used in this application.

In another well-known method, called SIMOX (separation by implantation of oxygen), a selected dose of oxygen ions is directly implanted into a Si wafer, and then the wafer is annealed in an oxygen ambient at a high temperature so that the implanted oxygen is converted into a continuous buried oxide layer. The thickness of the buried oxide layer in the SIMOX method is mostly dependent on the implanted oxygen dose and the thermal oxidation conditions. Moreover, in SIMOX, the Si over-layer is thinned to a desired thickness during the thermal oxidation, after which the surface oxide is stripped off.

Normally, a 3E17 cm$^{-2}$-5E17cm$^{-2}$ level of oxygen implantation dose is required in SIMOX to form a low-defect, continuous buried oxide layer that separates the Si over-layer from the substrate. In order to facilitate the implantation of this high level of oxygen ions in a reasonable period of time, high-current implanters are specifically built for SIMOX application at an extra cost. With the Si substrate scaling up to larger wafer sizes, the high-cost of scaled-up high-current implanters and the implantation process itself is becoming a serious issue.

Porous Si is formed by electrolytic anodization in an aqueous solution containing HF. An HF-resistant electrode, such as one made of platinum, is biased negatively, and a lightly or heavily p-doped Si substrate is biased positively. The porosity, measured in terms of the volume loss, of the resulting porous Si layer formed in the surface of a Si wafer is proportional to the electrical current and voltage and inversely proportional to the HF concentration. The depth of the porous Si layer formed is proportional to the anozidation time for a given dopant concentration. The actual structure of the porous Si, however, is a very complicated function of the type and concentration of dopants and defects, in addition to the above-mentioned parameters. A common characteristic of porous Si materials is the enormous surface area associated with high-density pores: The surface area per unit volume is estimated to be 100-200 m$^2$/cm$^3$. The presence of this large surface area makes porous Si very susceptible to chemical reaction with an ambient gas such as oxygen. The oxidation rate of porous Si is found to be an order of magnitude higher than that of bulk Si. This makes porous Si a good candidate for oxide isolation.

In a well-known method, called FIPOS (full isolation by porous oxidized silicon), porous Si is formed, by using a patterning procedure followed by HF-anodization, to surround shallow Si islands, and then the porous Si is oxidized to provide Si islands of full isolation. Although the oxidized porous Si provides good isolation, it is typically too thick relative to the Si islands and laterally non-uniform. This non-uniformity leads to warping of the Si wafer and formation of many oxidation-induced defects in the Si islands.

In view of the above drawbacks with the prior art methods of fabricating SOI substrate structures, there is a continued need for providing a new and improved method of forming SOI substrate structures that is relatively simple and inexpensive.

SUMMARY OF THE INVENTION

One object of the present invention is to provide a simple and cost effective method of fabricating silicon-on-insulator (SOI) substrate structures.

Another object of the present invention is to provide a method of fabricating SOI substrate structures in which the defect level is reduced by reducing implantation damages and by reducing the oxidation-induced stress and strain.

A further object of the present invention is to provide a simple and cost effective method of fabricating SOI substrate structures that are scalable to 300 mm.

A still further object of the present invention is to provide a method of fabricating SOI substrate structures in which wafer bonding and/or oxygen implantation are not used.

These and other objects and advantages are achieved by utilizing a method in which the SOI substrate structure is fabricated by oxidation of graded porous Si. The graded porous Si has a relatively coarse top layer and a fine porous layer that is buried beneath the top layer. Upon a subsequent oxidation step, the fine buried porous layer is converted into a buried oxide, while the coarse top layer coalesces into a solid Si-containing over-layer by surface migration of Si atoms. Much of this top Si layer becomes thermal oxide, which can be easily removed, leaving only a thin Si over-layer above the buried oxide.

When a blanket implantation is used in the method of the present invention, the graded porous Si is spatially uniform laterally on the surface of a Si-containing substrate, and, as the oxidation occurs uniformly from all areas of the surface, the buried oxide is uniform and the Si over-layer is relatively stress free.

The method of the present invention provides several added benefits over the conventional SIMOX method mentioned above. One such benefit is that costly high-current implanters are not employed. A related benefit is the reduction of the implantation-induced damages. Additionally, the oxidation-induced stress and strain is less because the porous Si expands less in volume than does bulk Si upon oxidation.

Specifically, and in broad terms, the method of the present invention comprises the steps of:

providing a graded porous Si-containing structure; and oxidizing said graded porous Si-containing structure to form a silicon-on-insulator (SOI) structure having a uniform buried oxide layer and a Si-containing over-layer.

The graded porous Si is formed in the present invention by first implanting a dopant (p- or n-type) into a Si-containing substrate, activating the dopant using an activation anneal step and then anodizing the implanted and activated dopant region in a HF-containing solution.

In one embodiment of the present invention, a short oxidation annealing step is used to create an intermediate SOI structure that includes a discontinuous oxide and a continuous oxide. Further annealing may be performed to convert the two different oxides into a continuous, single buried oxide region:

In other embodiment, two different implantation steps, i.e., dual implantation, are used. One of the implantation steps includes implanting an n-or p-type dopant into the structure, while the other implant step includes implanting an ion that causes damage formation and is neutral to Si into the structure. The neutral ion implantation may or may not form an amorphous region in the structure. The order of these two implants can be (A) implanting the n- or p-type dopant, followed by implanting the neutral ion; or (B) implanting the neutral ion, followed by implanting the n- or p-type dopant.

In still another embodiment of the present invention, two implant steps are preformed as described above and the ranges of the implanted peaks are substantially superimposed on each other.

The structure provided by the method of the present invention is an SOI substrate structure that includes a Si-containing over-layer of a desired thickness, a uniform buried oxide layer underneath the Si-containing over-layer, and a Si-containing substrate below the buried oxide. The Si-containing over-layer is substantially defect-free and thin (having a thickness on the order of less than about 100 nm). The buried oxide layer formed utilizing the method of the present invention is uniform with a thickness ranging from about 50 to about 200 nm. The term "uniform" is used in the present invention to denote a buried oxide layer having a continuous interface with the Si-containing over-layer as well as the underlying Si-containing substrate wherein the variation of thickness across the entire wafer is less than 20% of the total buried oxide thickness.

DETAILED DESCRIPTION OF THE INVENTION

Figure 1A:
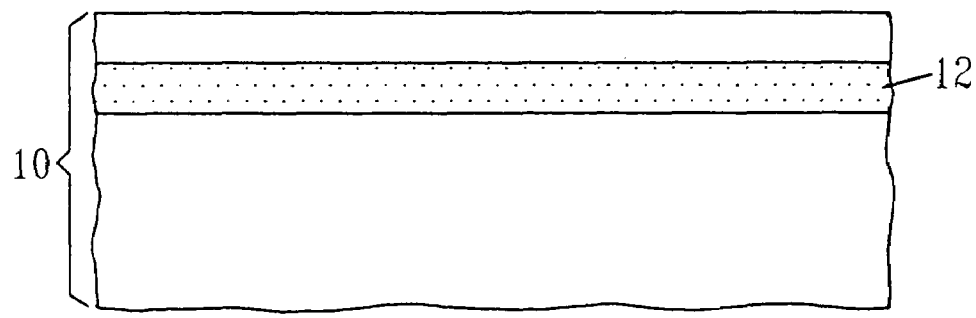
FIGS. 1A-1F are pictorial representations (through cross-sectional views) illustrating the basic processing steps of the present invention.

The present invention, which provides a simple and low-cost method for forming an SOI substrate structure having a uniform buried oxide layer underneath a Si-containing over-layer, will now be described in greater detail by referring to the drawings that accompany the present application. In the accompanying drawings, like and/or corresponding elements are referred to by like reference numerals.

Reference is first made to the initial structure shown in FIG. 1A which includes a Si-containing substrate 10 having a dopant region 12 formed therein. The term "Si-containing substrate" as used herein denotes a semiconductor material that includes at least silicon. Illustrative examples of such Si-containing substrates include, but are not limited to: Si, SiGe, SiC, SiGeC, epi-Si/Si, epi-Si/SiC, epi-Si/SiGe, and preformed silicon-on-insulators (SOIs) or SiGe-on-insulators (SGOIs) which may include any number of buried insulating (i.e., continuous, non-continuous or a combination of continuous and non-continuous) regions formed therein. The Si-containing substrate may be undoped, or doped. The doping within the Si-containing substrate 10 may be light (having a dopant concentration of less than 1E17 atoms/cm$^3$) or heavy (having a dopant concentration of about 1E17 atoms/cm$^3$ or greater).

More specific examples of Si-containing substrates include: p+ substrates, n-doped substrates, p−epi/p−substrate, p−epi/n−substrate, p+epi/p−substrate, p+epi/n−substrate, n−epi/p−substrate, n+epi/p−substrate, p+SiGe/p-Si, or p+, p-SOI. In one embodiment in which a doped Si-containing semiconductor substrate 10 is employed, it is preferred that the Si-containing semiconductor substrate 10 is a p+ substrate. When an epi layer is formed on top of a substrate, the epi layer is formed utilizing a conventional epitaxial growth method known to those skilled in the art.

The doped region 12 is either an n-type dopant region or a p-type dopant region that is formed into the Si-containing substrate 10 by ion implantation. In one embodiment, p-type dopants such as Ga, Al, B and BF$_2$, are employed. Of these p-type dopants, B and BF$_2$ are highly preferred.

The concentration of dopant being implanted during this step of the present invention may vary depending on the type of dopant being implanted. For n-type dopants, the concentration of dopant being implanted is typically from about 1E17 to about 1E21 atoms/cm$^3$, whereas for p-type dopants, the concentration of dopant being implanted is typically from about 1E17 to about 1E21 atoms/cm$^3$.

In accordance with the present invention, the n- or p-type dopant is implanted into the Si-containing substrate 10 such that the peak concentration of the dopant is at some predetermined depth that is below the upper surface of the substrate. More specifically, the implant conditions are sufficient to form a deep implant region that has a depth, as measured from the top surface of the substrate, of from about 250 to about 1500 nm. In a preferred embodiment, boron with an energy of about 100 keV to 500 keV and $BF_2$ with an energy of about 500 keV to about 2500 keV can be used to form implant region 12. The B and $BF_2$ dose is about 5E15 atoms/cm$^2$ to about 5E16 atoms/cm$^2$.

In some embodiments of the present invention, a neutral ion that causes damage formation within the Si-containing substrate 10 is used in conjunction with the dopant implantation mentioned above. The term "neutral ions" is used in the present invention to denote any ion that does not interact with the Si-containing substrate 10. Illustrative examples of such neutral ions include, but are not limited to: Si, Ge, Ne, Bi, Sn, Xe and the like. Preferably, Si is used as the neutral ion. The neutral ion causes damage formation which is believed to aid in the formation of the porous Si region. The damage region is created above, below, or within the dopant region 12. The neutral ion may be implanted prior to, or after the dopant implantation step. Depending on the implant conditions and neutral ion employed, this implant step may form an amorphized region within the Si-containing substrate 10. In one embodiment, the peak of the neutral ion peak matches that of the dopant ion implant such that the two implants are superimposed on each other.

The conditions for this optional neutral ion implantation step may vary depending on the ion employed as well as the desired depth of the same. In a preferred embodiment, Si is implanted using an energy of about 200 keV to 500 keV and a dose from about 1E14 atoms/cm$^2$ to about 1E16 atoms/cm$^2$ at nominal room temperature or below. When employed, the two implantation steps, i.e., dual implantation, can be used to create a single or double SOI structure depending on the conditions used during the thermal oxidation.

Figure 1B:
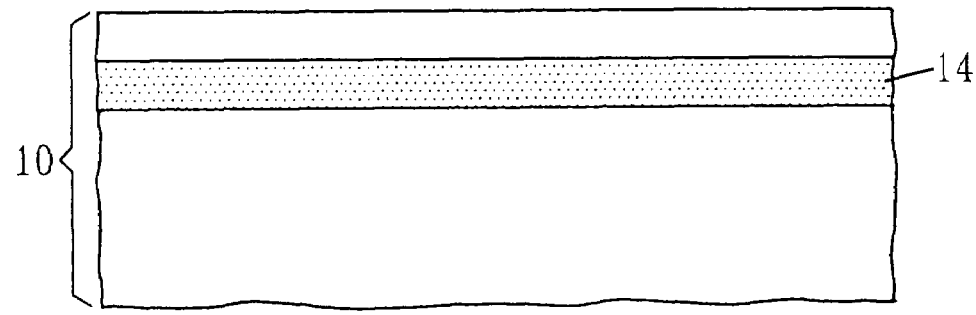

Next, the structure shown in FIG. 1A is annealed to activate the dopants within the dopant region 12 to create holes (for p-type dopants) or electrons (for n-type electrons). The structure after annealing is shown in FIG. 1B. In FIG. 1B, reference numeral 14 denotes the activated dopant implant region that is formed after annealing. In general, for high annealing temperatures, more dopant ions are activated, while, at the same time, the dopant ions diffuse more leading to broadening of the implantation profile. In accordance with the present invention, the annealing step must be preformed at a temperature in which at least the dopant ions at the concentration peak are mostly activated. In regions surrounding the concentration peak, dopant ions are typically not activated to the full extent indicating that the Si lattice in the regions still remains somewhat disordered from the implantation damage. In some instances, the carrier profile may contain peaks and valleys due to a non-activated dopant.

The annealing used at this point of the present invention may include a furnace anneal, a rapid thermal anneal, or a spike anneal. When a furnace anneal is employed, the furnace anneal is typically carried out at a temperature of about 600° C. or greater for a time period of about 15 minutes or greater. Preferably, the furnace anneal is performed at a temperature of from about 650° C. to about 800° C. for a time period of from about 15 to about 250 minutes. The furnace anneal is typically performed in the presence of an inert gas atmosphere and/or an oxidizing ambient including, for example, He, Ar, $O_2$, $N_2$ and mixtures thereof.

When a rapid thermal anneal (RTA) is employed, the RTA is typically carried out at a temperature of about 800° C. or greater for a time period of about 5 minutes or less. Preferably, the RTA is performed at a temperature of from about 900° C. to about 1050° C. for a time period of from about 5 to about 30 seconds. The RTA is typically performed in the presence of an inert gas atmosphere and/or an oxidizing ambient including, for example, He, Ar, $O_2$, $N_2$ and mixtures thereof.

When a spike anneal is performed, the spike anneal is typically performed at a temperature of about 900° C. or greater for a time period of about 1 second or less. Preferably, the spike anneal is performed at a temperature of from about 900° C. to about 1100° C. The spike anneal is typically performed in the presence of an inert gas atmosphere and/or an oxidizing ambient including, for example, He, Ar, $O_2$, $N_2$ and mixtures thereof.

Of the various annealing techniques mentioned above, it is preferred to use a furnace anneal. When B is the dopant, and a furnace anneal is employed, it is preferred that the anneal is carried out at about 650° C. for 2-3 hours.

Figure 1C:
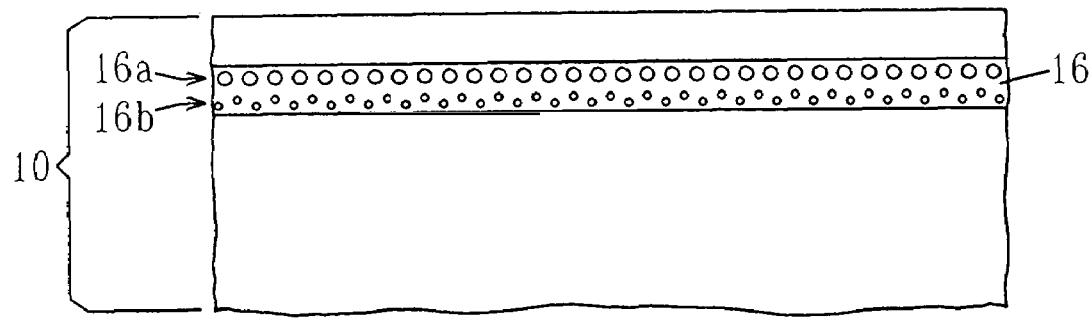

Next, and as shown in FIG. 1C, the structure shown in FIG. 1B is subjected to an electrolytic anodization process that is capable of converting the activated dopant region 14 into a porous region 16. The structure shown in FIG. 1C may be referred to a graded porous Si-containing structure. The porous Si region 16 has a structure that closely reflects the carrier and damage profile. That is, the region with high residual implantation damage and low carrier concentration results in a coarse porous structure, while the region with high carrier concentration results in a fine porous structure. As such, the porous structure is not uniform, but rather graded.

The fine porous region 16b is located mostly at the bottom of porous region 16, while the courser porous region 16a is located mostly at the top of porous region 16. The fine porous region is less dense (i.e., contains a lower number of pores) as compared to the courser porous Si region. As the surface area of the fine porous Si is immensely large, any type of surface reaction, including oxidation, would occur faster in the fine porous Si region than the courser porous Si region because of a higher surface area.

The anodization process is performed by immersing the structure shown in FIG. 1B into an HF-containing solution while an electrical bias is applied to the structure with respect to an electrode also placed in the HF-containing solution. In such a process, the structure typically serves as the positive electrode of the electrochemical cell, while another semiconducting material such as Si, or a metal is employed as the negative electrode.

In general, the HF anodization converts doped single crystal Si into porous Si. The rate of formation and the nature of the porous Si so-formed (porosity and microstructure) is determined by both the material properties, i.e., doping type and concentration, as well as the reaction conditions of the anodization process itself (current density, bias, illumination and additives in the HF-containing solution). Specifically, the porous Si forms with greatly increased efficiency in the higher doped regions and therefore, the activated dopant region 14 is converted into porous Si efficiently.

Generally, the porous Si region 16 formed in the present invention has a porosity of about 0.01% or higher. The depth of the porous Si region 16, as measured from the uppermost surface of the structure to the uppermost surface of the porous Si, is about 50 nm or greater.

The term "HF-containing solution" includes concentrated HF (49%), concentrated HF and acetic acid, a mixture of HF and water, a mixture of HF and a monohydric alcohol such as methanol, ethanol, propanol, etc, or HF mixed with at least one surfactant. The amount of surfactant that is present in the HF solution is typically from about 1 to about 80%, based on 49% HF.

The anodization process, which converts the activated dopant region 14 into a porous Si region 16 that is graded, is performed using a constant current source that operates at a current density of from about 0.05 to about 50 milliAmps/cm$^2$. A light source may be optionally used to illuminate the sample. More preferably, the anodization process of the present invention is employed using a constant current source operating at a current density of from about 0.1 to about 5 milliAmps/cm$^2$.

The anodization process is typically performed at room temperature or at a temperature that is elevated from room temperature may be used. Following the anodization process, the structure is typically rinsed with deionized water and dried.

Figure 1D:
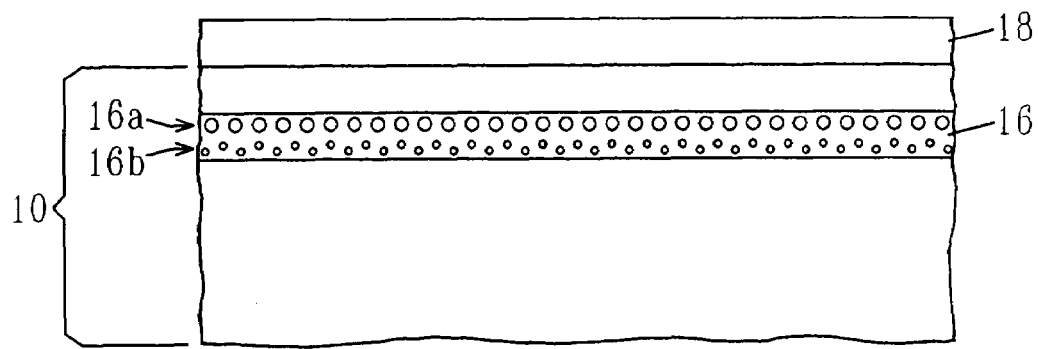

In an optional embodiment of the present invention, an optional cap layer 18 is formed atop the Si-containing substrate 10 containing porous region 16 at this point of the present invention. The structure including the optional cap layer 18 is shown, for example, in FIG. 1D. The optional cap layer 18 employed in the present invention comprises any Si-containing material including, for example, epitaxial Si (epi-Si), SiGe, amorphous Si (a:Si), single or polycrystalline Si or any combination thereof. Of the various Si materials listed above, it is preferred that epi-Si or SiGe be employed as the optional cap layer 18.

When present, the optional cap layer 18 has a thickness of from about 1 to about 100 nm, with a thickness of from about 1 to about 50 nm being more highly preferred. The optional cap layer 18 is formed using known deposition processes including one of the epitaxial growth processes mentioned above.

Figure 1E:
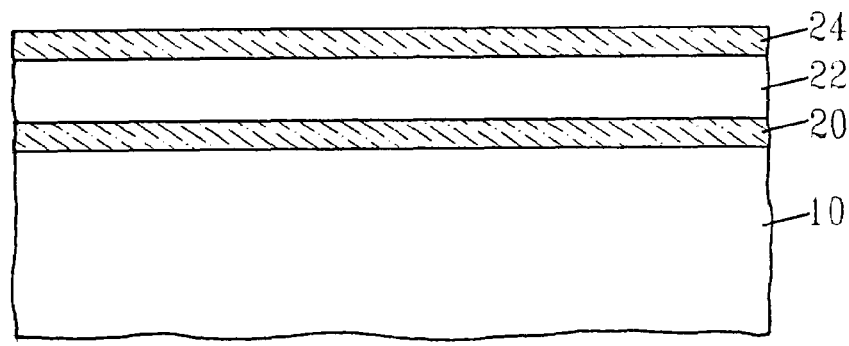
Figure 1F:
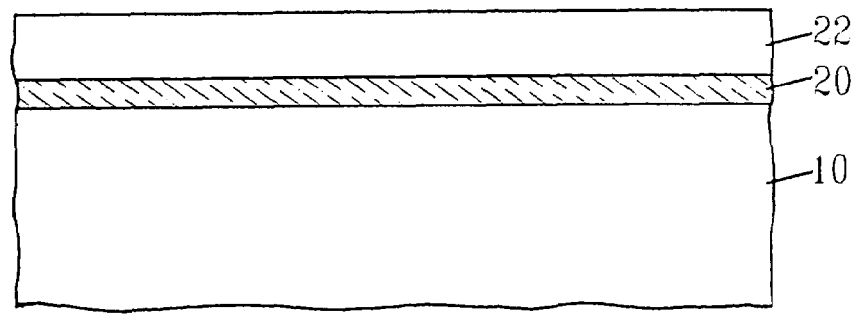

The structure including the thus formed porous Si region 16, without or without the optional cap layer 18, is then heated, i.e., annealed, using a dry thermal oxidation process at a temperature which converts the porous Si region 16 into a buried oxide region 20. The resultant structure including buried oxide region 20 and Si-containing over-layer 22 is shown, for example, in FIG. 1E. Note that an oxide layer 24 is formed atop layer 22 during the heating step. This surface oxide layer, i.e., oxide layer 24, is typically, but not always, removed from the structure after the heating step using a conventional wet etch process wherein a chemical etchant such as HF that has a high selectivity for removing oxide as compared to silicon is employed. FIG. 1F shows the structure after the surface oxide layer 24 has been removed.

In accordance with the present invention, the fine porous Si region transforms into the buried oxide region 20, while the coarse porous Si region typically coalescene into monocrystalline Si and then into the Si-containing over-layer 22. The thickness of the buried oxide and the Si-containing over-layer can be controlled to desired values by adjusting the thermal oxidation conditions.

The surface oxide layer 24 formed after the heating step of the present invention has a variable thickness which may range from about 10 to about 1000 nm, with a thickness of from about 20 to about 500 nm being more typical.

Specifically, the heating step of the present invention is a dry thermal oxidation process that is performed at a temperature from about 650° to about 1350° C., with a temperature from about 1200° to about 1325° C. being more highly preferred. In some embodiments of the present invention, particularly when a broken, i.e., discontinuous buried oxide, and a continuous buried oxide are desired, the thermal oxidation may be performed at temperatures that are lower than 650° C. Typically, for this embodiment of the present invention, a broken buried oxide can be formed by thermal oxidation that is performed at a temperature of from about 1250° to about 1325° C. Further annealing may be performed within the general temperature ranges mentioned above in converting the structure containing the broken buried oxide and continuous buried oxide into a structure containing a single buried oxide structure.

Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. When a diluted ambient is employed, the diluted ambient contains from about 0.5 to about 100% of oxygen-containing gas, the remainder, up to 100%, being inert gas.

The heating step may be carried out for a variable period of time that typically ranges from about 10 to about 1800 minutes at 1250° to about 1325° C., with a time period from about 60 to about 600 minutes being more highly preferred. The heating step may be carried out at a single targeted temperature, or various ramp and soak cycles using various ramp rates and soak times can be employed.

In some embodiments of the present invention, a pre-oxidation step is performed. The pre-oxidation step is carried out in a wet oxygen ambient such as steam at a temperature from about from about 600° to about 1200° C., with a temperature from about 800° to about 1000° C. being more highly preferred. The pre-oxidation step is advantageous in that it converts the porous Si into an oxide at an accelerated rate before it coalesces into large Si grains.

In another embodiment of the present invention wherein excess dopant ions are implanted, a post oxidation thermal anneal in a hydrogen ambient at atmospheric or reduced pressure can be used to reduce the level of dopants within the Si-containing over-layer. When such a post oxidation process is performed, the thermal anneal in a hydrogen ambient is performed at a temperature from about 900° to about 1200° C., with a temperature from about 1000° to about 1050° C. being more highly preferred. Examples of hydrogen ambients include $H_2$, $NH_4$, or mixtures thereof, including mixtures with, or without, an inert gas. The concentration of dopant ions with the Si-containing over-layer may be reduced by more than two orders of magnitude using the aforementioned post oxidation thermal anneal.

In accordance with the present invention, the Si-containing over-layer 22 has a thickness of about 1000 nm or less, with a thickness of from about 100 to about 500 nm being more highly preferred. Note that the Si-containing over-layer 22 formed in the present invention is a thin layer that is substantially defect free. The buried oxide layer 20 formed during the heating step has a thickness of about 100 to about 200 nm. The buried oxide layer 20 has a smooth and continuous interface with the Si-containing over-layer 22.

As stated above, the surface oxide layer 24 may be stripped at this point of the present invention so as to provide the Si-on-insulator substrate material shown, for example, in FIG. 1F.

Figure 2A:
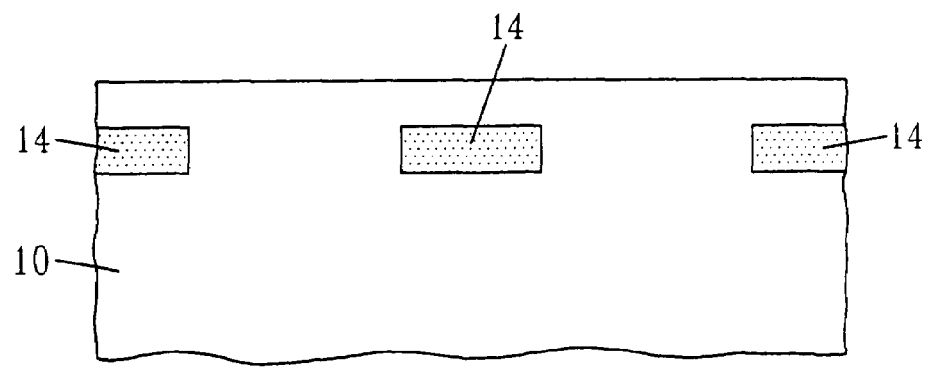
FIGS. 2A-2C are pictorial representations (through cross sectional views) illustrating an alternative embodiment of the present invention.

In addition to the unpatterned structure shown in FIGS. 1A-1F above, the present invention also contemplates the formation of a patterned structure. The patterned structure and the process used in forming the same is shown, for example, in FIGS. 2A-2C. Specifically, FIG. 2A shows an initial structure of this embodiment in which the Si-containing substrate 10 has discrete and isolated islands of implanted and activated dopant regions 14 formed therein. The discrete and isolated islands of implanted and activated dopant regions can be formed by using a masked ion implantation process.

Figure 2B:
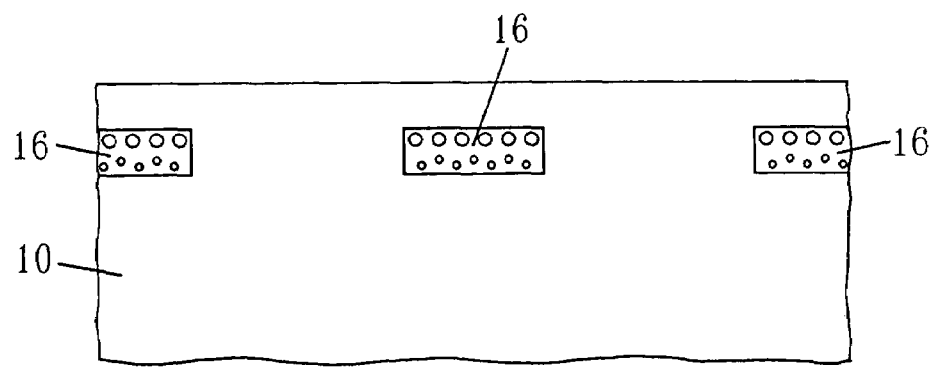

Next, the structure shown in FIG. 2B is subjected to the above described anodization process. As stated above, the anodization process forms porous Si regions 16 in the substrate. An optional cap layer, not shown, may then be formed atop the structure.

Figure 2C:
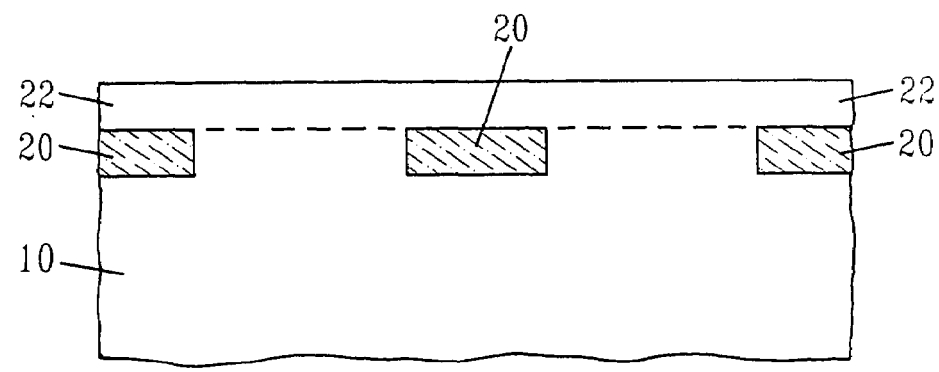

The structure, with or without the optional cap layer, is then subjected to the above-described annealing step providing the structure shown, for example, in FIG. 2C. Note that reference numerals 10, 20 and 22 have the same meaning as described above; the surface oxide layer 24 has been removed from this structure.

Figure 3A:
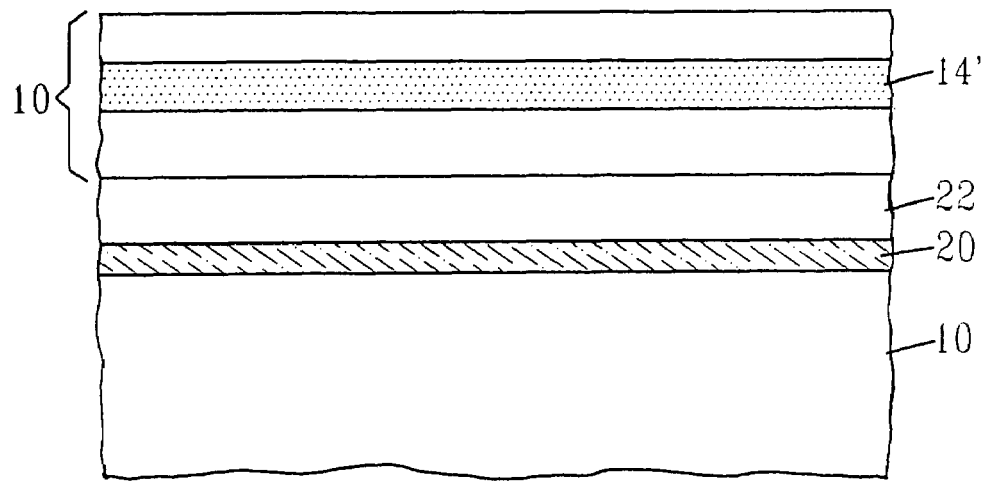
FIGS. 3A-3B are pictorial representations (through cross sectional views) illustrating another alternative embodiment of the present invention.
Figure 3B:
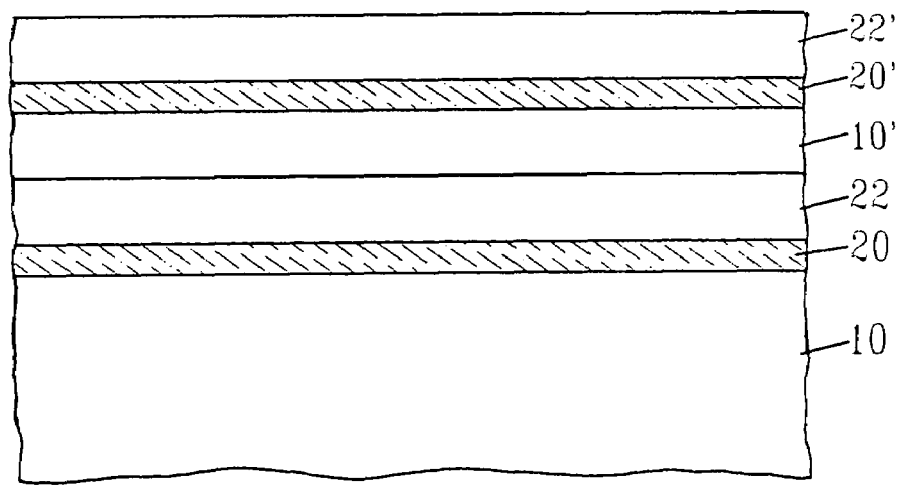

FIGS. 3A-3B show another alternative embodiment of the present invention in which a double SOI layer is formed in the same structure. The double SOI layer is formed by first performing the steps described above in providing the structure shown in FIG. 1F. After providing the structure, a Si-containing substrate 10' having an implanted and activated dopant 14' is formed atop the structure. FIG. 3A provides an illustration of this structure. Next, the steps of anodization and annealing are repeated providing the structure shown, for example, in FIG. 3B. In FIG. 3B, a second buried oxide layer 20' is formed as well as a second Si-containing over-layer 22'. The same procedure can be repeated numerous times to provide a multi-SOI layered structure. The multi-SOI layers may all be continuous, be discontinuous or they may exist as a combination thereof.

Figure 4:
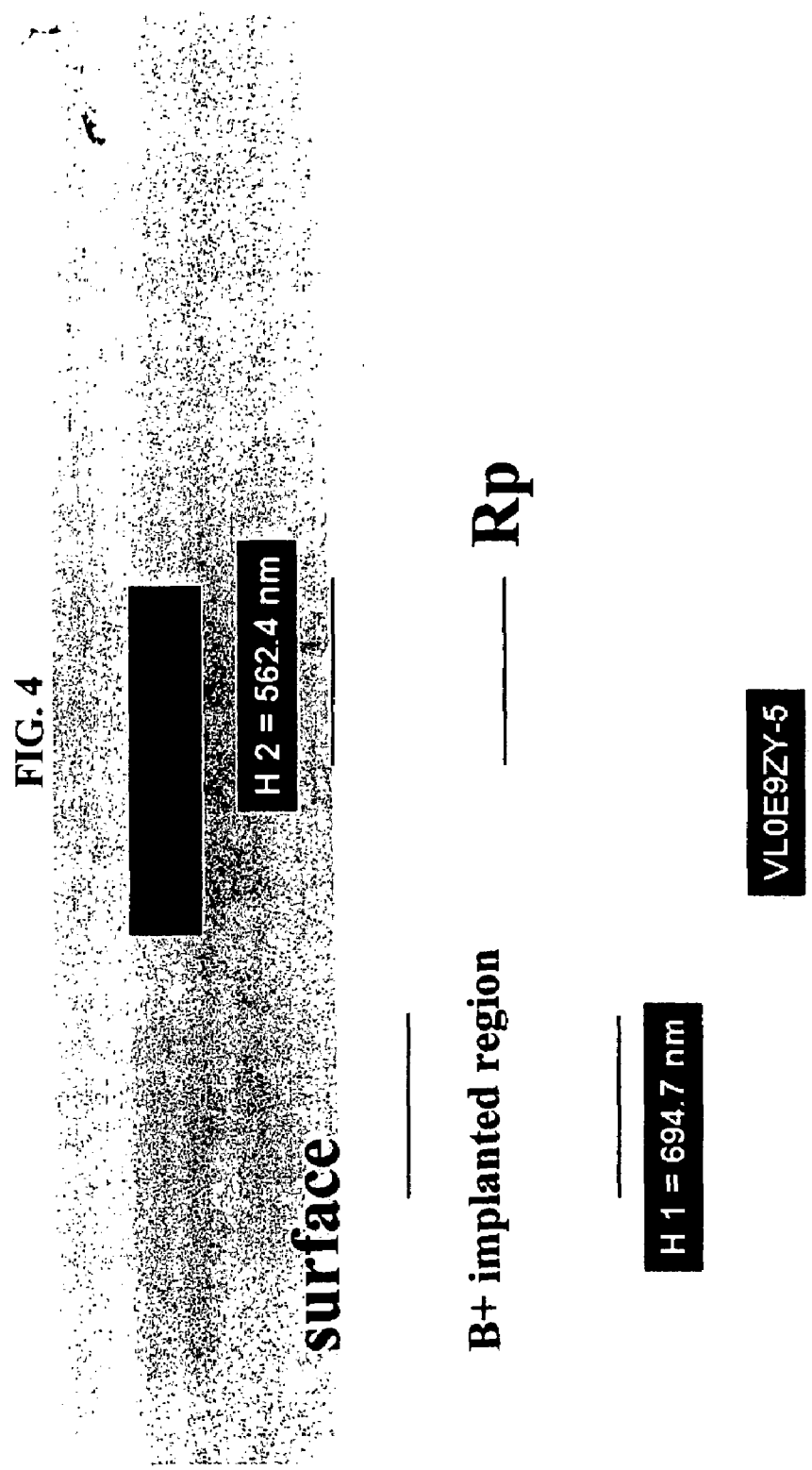
FIG. 4 is a cross-sectional SEM image of a buried porous-Si structure of the present invention.

FIG. 4 shows an actual SEM image of a porous Si structure produced using the method of the present invention. The porous Si structure was prepared by implanting B into a p-/p+ Si substrate at 220 keV using a B dose of about $2E16$ cm$^{-2}$ followed by annealing at 650° C. for 2 hr 45 minutes. The implanted and activated substrate was then anodized in HF (49%) for 1 min or less to provide the porous Si structure shown in FIG. 4. The structure shown in FIG. 4 includes an upper graded region of fine porous Si with a well-defined band corresponding to the peak region of the implanted B profile. The porous Si structure shown in FIG. 4 may than be oxidized as described above to provide an SOI structure.

Figure 5:
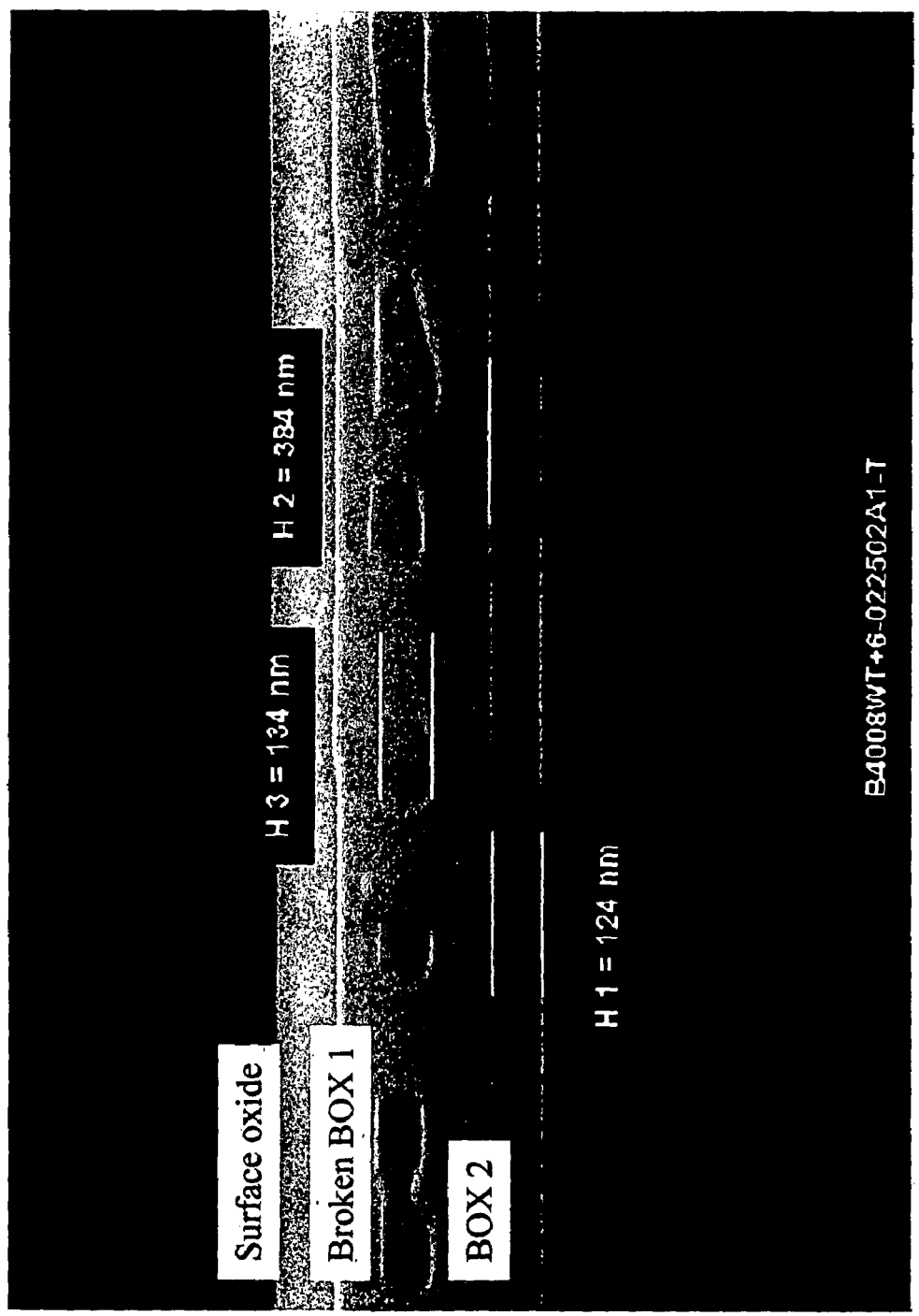
FIG. 5 is a cross-sectional SEM image of a SOI substrate structure of the present invention in which a discontinuous, i.e., broken, oxide and continuous oxide are formed.

FIG. 5 shows an SEM of an SOI structure formed by porous-Si from B+ implantation. The implantation conditions used in forming the porous-Si structure was as follows: B+ implant, dose $2E16$ atoms/cm$^2$, and implant energy: 220 keV. Anodization was performed using conditions mentioned above. The dopant activation step was performed at 650° C. for 2 hrs 45 minutes prior to porous Si formation. The SOI structure includes four layers: (i) the topmost Si layer extending from the surface to the top of the broken buried oxide (labeled as BOX 1), (ii) a layer of broken buried oxide (labeled as BOX 1), (iii) a layer of Si sandwiched between the broken oxide (labeled as BOX1) and a continuous oxide (labeled as BOX 2), and (iv) a continuous buried oxide layer (labeled as BOX2). Further oxidizing may be performed to consume layers (i) and (ii) above resulting in an SOI structure having a single layer of Si (layer (iii) above) over a continuous BOX layer (layer (iv) above).

Figure 6:
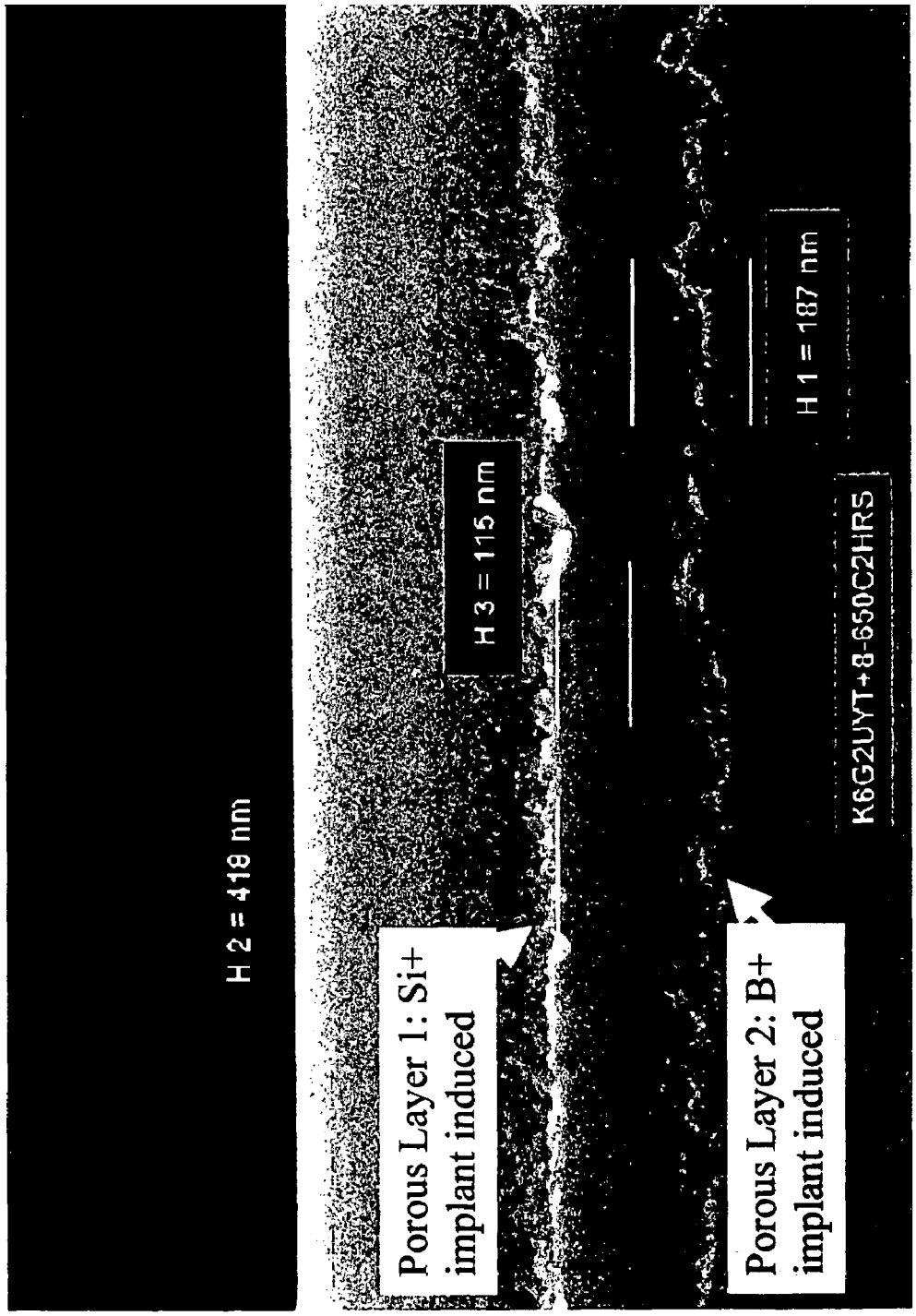
FIG. 6 is a cross-sectional SEM image of an engineered porous Si-containing structure of the present invention that is achieved using dual implantation.

FIG. 6 shows an SEM of an engineered porous Si structure that was prepared using a dual implantation process. Specifically, the dual implantation process included the following: B+ implant, 220 keV, $2E16$ atoms/cm$^2$; and Si+ implant, 220 keV, $2E15$ atoms/cm$^2$. Anodization was performed using conditions mentioned above. Two bands of porous-Si are present in the SEM micrograph. The first band corresponds to the peak region of the implanted Si+ profile, and the second band corresponds to the peak region of the implanted boron profile.

Figure 7:
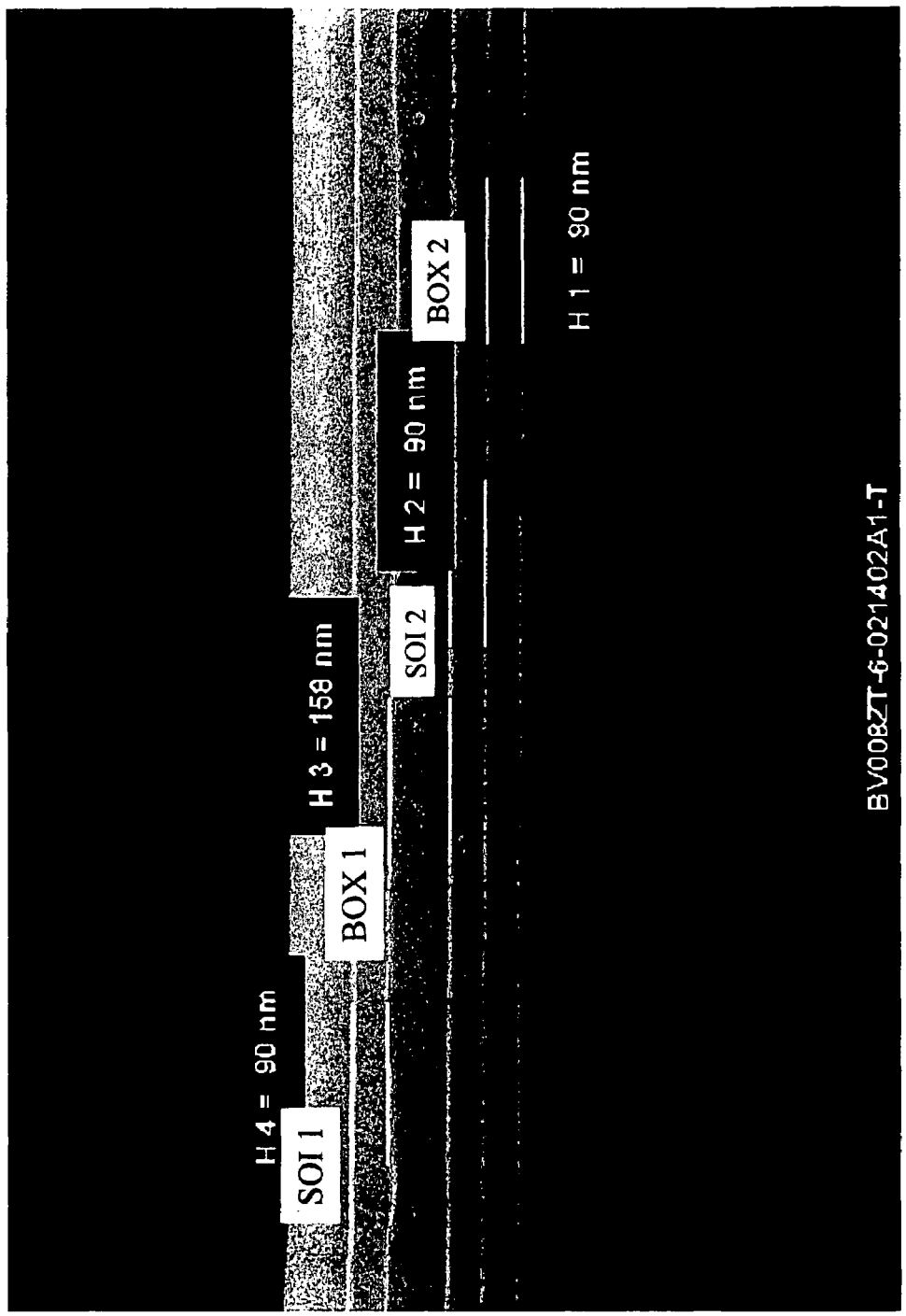
FIG. 7 is a cross-sectional SEM image of a double SOI substrate structure of the present invention which is prepared by engineering of porous Si by dual implantation.

FIG. 7 shows an SEM of a double SOI that was formed by engineering of a porous-SI structure by dual implantation. The follow conditions were used in forming the structure shown in FIG. 7: B+, 180 keV, $2E16$ atoms/cm$^2$; Si+, 220 keV, $2E15$ atoms/cm$^2$. As shown, the structure includes two SOI layers and two BOX regions. BOX 1 corresponds to the first band of porous-Si in FIG. 6, whereas BOX 2 corresponds to the second band of porous-Si in FIG. 6. Some of the surface Si of FIG. 6 was consumed by anneal oxidation that was required to form continuous buried oxide regions.

Figure 8:
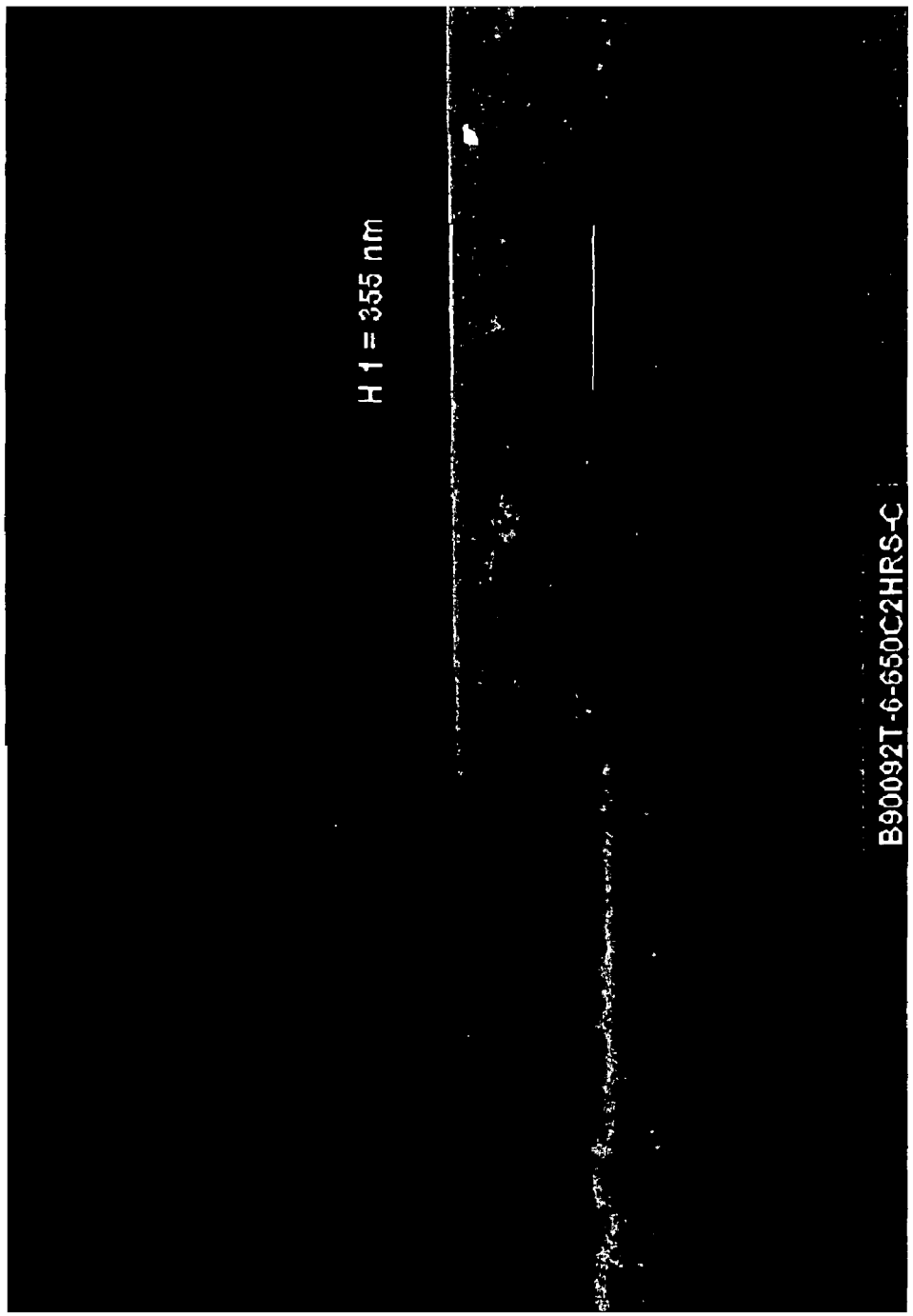
FIG. 8 is a cross-sectional SEM image of an engineered porous Si-containing structure of the present invention that is achieved by dual implantation.

FIG. 8 shows an SEM of a engineered porous Si containing structure by dual implantation. The structure was formed using the following conditions: B+, 160 keV, $2E16$ atoms/cm$^2$; Si+, 220 keV, $2E15$ atoms/cm$^2$. The implant conditions of B+ and Si+ were so chosen that the projected ranges of the B+ and Si+ nearly coincided with each other. Therefore the porous-Si bands of FIG. 6 are superimposed on each other in this case resulting in a single porous-Si band but with a high density of pores.

Figure 9:
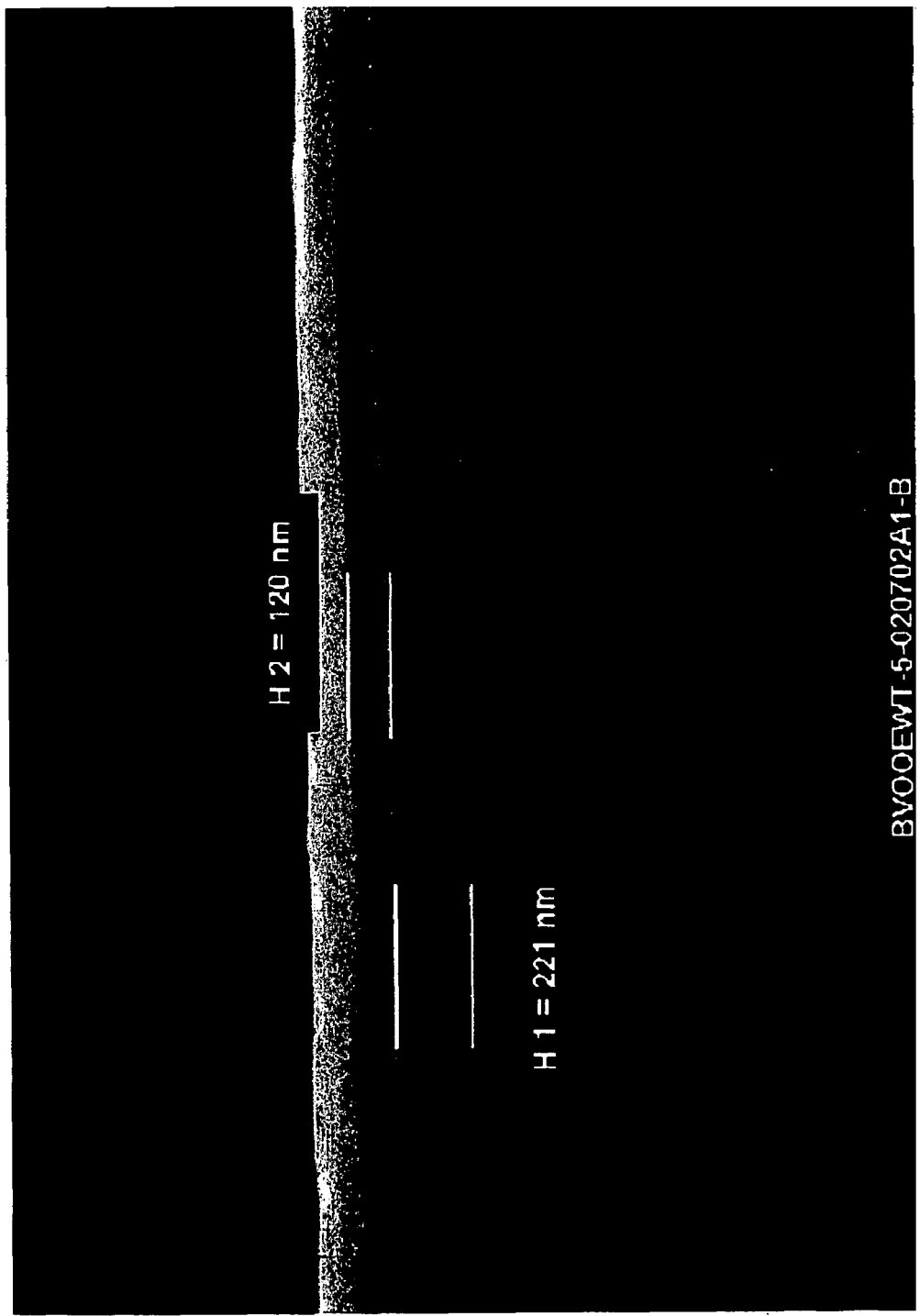
FIG. 9 is a cross-sectional SEM image of a SOI substrate structure of the present invention by dual implantation.

FIG. 9 shows an SEM of a single SOI prepared by dual implantation. The structure was formed using the following conditions: B+, 150 keV, $2E16$ atoms/cm$^2$; Si+, 220 keV, $2E15$ atoms/cm$^2$ followed by dopant activation anneal, porous-Si formation, and high temperature anneal as described above. The location of the buried oxide layer corresponds to that of the band of dense porous-Si in FIG. 8.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a silicon-on-insulator substrate comprising:

a first ion implanting step to implant p-type or n-type dopants into a Si-containing substrate to a depth ranging from 250 nm to 1500 nm from a top surface of the Si-containing substrate;

a second ion implanting step following the first ion implanting step to implant at least one ion selected from the group consisting of Si, Ge, Ne, Bi, Sn and Xe, wherein the at least one ion may be implanted to below, above or within the depth at which the p-type or n-type dopants are present in the Si-containing substrate;

annealing the n-type or p-type dopants following the second ion implanting step to provide an activated n-type or p-type dopant region in the Si-containing substrate;

performing an electrolytic anodization process comprising immersing the Si-containing substrate into an HF-containing solution and applying a current density ranging from 0.05 milliAmps/cm$^2$ to 50 milliAmps/cm$^2$ to the Si-containing substrate to produce a porous Si region having a porosity of 0.01% or greater at a depth greater than 50 nm from the upper surface of the Si-containing substrate, wherein the electrolytic anodization process converts the activated n-type or p-type dopant region into the porous Si region; and thermal oxidizing at a temperature ranging from 650° C. to 1350° C. to convert at least a portion of the porous Si region into a buried oxide region, wherein a portion of the Si-containing substrate overlying the buried oxide region and a remaining portion of the porous Si region coalesces to provide a Si-containing overlayer.

2. The method of claim 1 wherein the first ion implanting step of the p-type or n-type dopants is ion implanting the p-type dopant in which the p-type dopant is selected from the group consisting of Ga, Al, B and $BF_2$.

3. The method of claim 2 wherein the p-type dopant is B, said B is implanted at an energy of from about 100 keV to about 500 keV and a dose of about 5E15 atoms/cm$^2$ to about 5E16 atom/cm$^2$.

4. The method of claim 2 wherein the p-type dopant is $BF_2$, said $BF_2$ is implanted at an energy of from about 500 keV to about 2500 keV and a dose of about 5E15 atoms/cm$^2$ to about 5E16 atom/cm$^2$.

5. The method of claim 1 wherein the annealing comprises a furnace anneal, a rapid thermal anneal, or a spike anneal.

6. The method of claim 5 wherein the annealing is a furnace anneal step, said furnace anneal step is carried out at a temperature of about 600° C. or greater for a time period of about 15 minutes or greater in the presence of an inert gas atmosphere, an oxidizing ambient or a mixture thereof.

7. The method of claim 5 wherein the annealing is a rapid thermal anneal (RTA) step, said RTA step is carried out at a temperature of about 800° C. or greater for a time period of about 5 minutes or less in the presence of an inert gas atmosphere, an oxidizing ambient or a mixture thereof.

8. The method of claim 5 wherein the annealing is a spike annealing step, said spike annealing step is performed at a temperature of about 900° C. or greater for a time period of about 1 second or less in the presence of an inert gas atmosphere, an oxidizing ambient or a mixture thereof.

9. The method of claim 1 further comprising forming a cap layer atop the Si-containing substrate after said electrolytic anodization process, but prior to said oxidizing.

10. The method of claim 9 wherein the cap layer comprises a Si-containing material.

11. The method of claim 1 wherein the thermal oxidizing is performed in an oxygen-containing ambient.

12. The method of claim 11 wherein the oxygen-containing ambient further comprises an inert gas.

13. The method of claim 12 wherein the oxygen-containing ambient is selected from the group consisting of $O_2$, NO, $N_2O$, ozone, and air.

14. The method of claim 1 wherein the thermal oxidizing is performed at a temperature of from about 1200° C. to about 1325° C.

15. The method of claim 1 wherein the thermal oxidizing forms a surface oxide atop the Si-containing over-layer.

16. The method of claim 1 wherein the buried oxide region is uniform.

17. The method of claim 1 wherein the buried oxide region comprises discrete islands of thermal oxide.

18. The method of claim 1 further comprising a pre-oxidization step prior to said thermal oxidizing, said pre-oxidization step includes oxidation in a wet oxygen ambient.

19. The method of claim 18 wherein said pre-oxidization step is performed at a temperature from about 600° C. to about 1200° C.

20. The method of claim 1 further comprising a post oxidation step, said post oxidation step comprising a thermal anneal in a hydrogen ambient.

21. The method of claim 20 wherein the post oxidation step is performed at a temperature from about 900° C. to about 1200° C.

22. The method of claim 1 wherein said at least one ion of said second ion implanting step is Si and said second ion implanting step is performed using a Si dose from about 1E15 to about 1E16 atoms/cm$^2$ and an implant energy from about 200 to about 500 keV.

23. The method of claim 1 further comprising patterning the Si-containing substrate prior to the ion implanting of the p-type or n-type dopants into the Si-containing substrate.

* * * * *